(12) United States Patent
Loubet et al.

(10) Patent No.: US 8,759,874 B1
(45) Date of Patent: Jun. 24, 2014

(54) FINFET DEVICE WITH ISOLATED CHANNEL

(71) Applicant: STMicroelectronics, Inc., Coppell, TX (US)

(72) Inventors: Nicolas Loubet, Guilderland, NY (US); Prasanna Khare, Schenectady, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/691,070

(22) Filed: Nov. 30, 2012

(51) Int. Cl.
  *H01L 31/0328* (2006.01)
  *H01L 31/0336* (2006.01)
  *H01L 31/072* (2012.01)
  *H01L 31/109* (2006.01)

(52) U.S. Cl.
  USPC .... 257/192; 257/368; 257/390; 257/E27.059; 257/E27.06; 257/E51.006

(58) Field of Classification Search
  CPC ............ H01L 27/0886; H01L 27/0924; H01L 27/10826; H01L 27/10879; H01L 27/1211; H01L 29/785
  USPC ......... 257/192, 206, 241, 347, 368, 369, 382, 257/390, 395, E27.059, E27.06, E51.006
  See application file for complete search history.

(56) References Cited

U.S. PATENT DOCUMENTS

| | | | |
|---|---|---|---|
| 6,413,802 B1 | 7/2002 | Hu et al. | |
| 7,101,763 B1 | 9/2006 | Anderson et al. | |
| 7,427,794 B2 | 9/2008 | Chau et al. | |
| 7,456,476 B2 | 11/2008 | Hareland et al. | |
| 7,973,389 B2 | 7/2011 | Rios et al. | |
| 8,120,073 B2 | 2/2012 | Rakshit et al. | |
| 2004/0217434 A1 | 11/2004 | Lee et al. | |
| 2007/0267695 A1 | 11/2007 | Lee | |

(Continued)

FOREIGN PATENT DOCUMENTS

DE 10 2010 029527 A1 12/2011

OTHER PUBLICATIONS

Crothers, "How Intel's 3D tech redefines the transistor (FAQ)," CNETNews.com, dated May 4, 2011, accessed on Feb. 28, 2013, retrieved from URL= http://news.cnet.com/8301-13924_3-20059431-64.html, 10 pages.

(Continued)

*Primary Examiner* — Hoai V Pham
(74) *Attorney, Agent, or Firm* — Seed IP Law Group PLLC

(57) ABSTRACT

Despite improvements in FinFETs and strained silicon devices, transistors continue to suffer performance degradation as device dimensions shrink. These include, in particular, leakage of charge between the semiconducting channel and the substrate. An isolated channel FinFET device prevents channel-to-substrate leakage by inserting an insulating layer between the channel (fin) and the substrate. The insulating layer isolates the fin from the substrate both physically and electrically. To form the isolated FinFET device, an array of bi-layer fins can be grown epitaxially from the silicon surface, between nitride columns that provide localized insulation between adjacent fins. Then, the lower fin layer can be removed, while leaving the upper fin layer, thus yielding an interdigitated array of nitride columns and semiconducting fins suspended above the silicon surface. A resulting gap underneath the upper fin layer can then be filled in with oxide to isolate the array of fin channels from the substrate.

20 Claims, 11 Drawing Sheets

(56) References Cited

U.S. PATENT DOCUMENTS

| | | |
|---|---|---|
| 2008/0237655 A1 | 10/2008 | Nakabayashi et al. |
| 2009/0090976 A1 | 4/2009 | Kavalieros et al. |
| 2009/0230478 A1 | 9/2009 | Pillarisetty et al. |
| 2010/0015778 A1 | 1/2010 | Lin et al. |
| 2011/0193178 A1 | 8/2011 | Chang et al. |
| 2011/0316080 A1 | 12/2011 | Luo et al. |
| 2012/0138886 A1 | 6/2012 | Kuhn et al. |
| 2013/0043506 A1* | 2/2013 | Tsai et al. ................. 257/192 |

OTHER PUBLICATIONS

Markoff, "Intel Increases Transistor Speed by Building Upward," NYTimes.com, dated May 5, 2011, accessed on Sep. 13, 2012, retrieved from URL=http://www.nytimes.com/2011/05/05/science/05chip.html, 3 pages.

"New Transistor Grows in the Third Dimension," NYTimes.com, dated May 5, 2011, accessed on Sep. 13, 2012, retrieved from URL=http://graphics8.nytimes.com/images/2011/05/05/science/05chip_graphic/05chip_graphic-popup-v2.jpg, 1 page.

"Tutorial: Intel 22nm 3D Tri-Gate FinFETs Transistors," RMG & Associates, Inc., accessed on Oct. 1, 2012, retrieved from URL= http://maltiel-consulting.com/Intel_22nm_3D_Tri-Gate_FinFETs_Transistors_maltiel_semiconductor_consulting.html, 8 pages.

Extended European Search Report for EP Application No. 13194927.3 mailed Feb. 28, 2014, 12 pages.

Jurczak et al., "Silicon-on-Nothing (SON)—an Innovative Process for Advanced CMOS", IEEE Transactions on Electron Devices, vol. 47, No. 11, Nov. 2000, 10 pages.

* cited by examiner

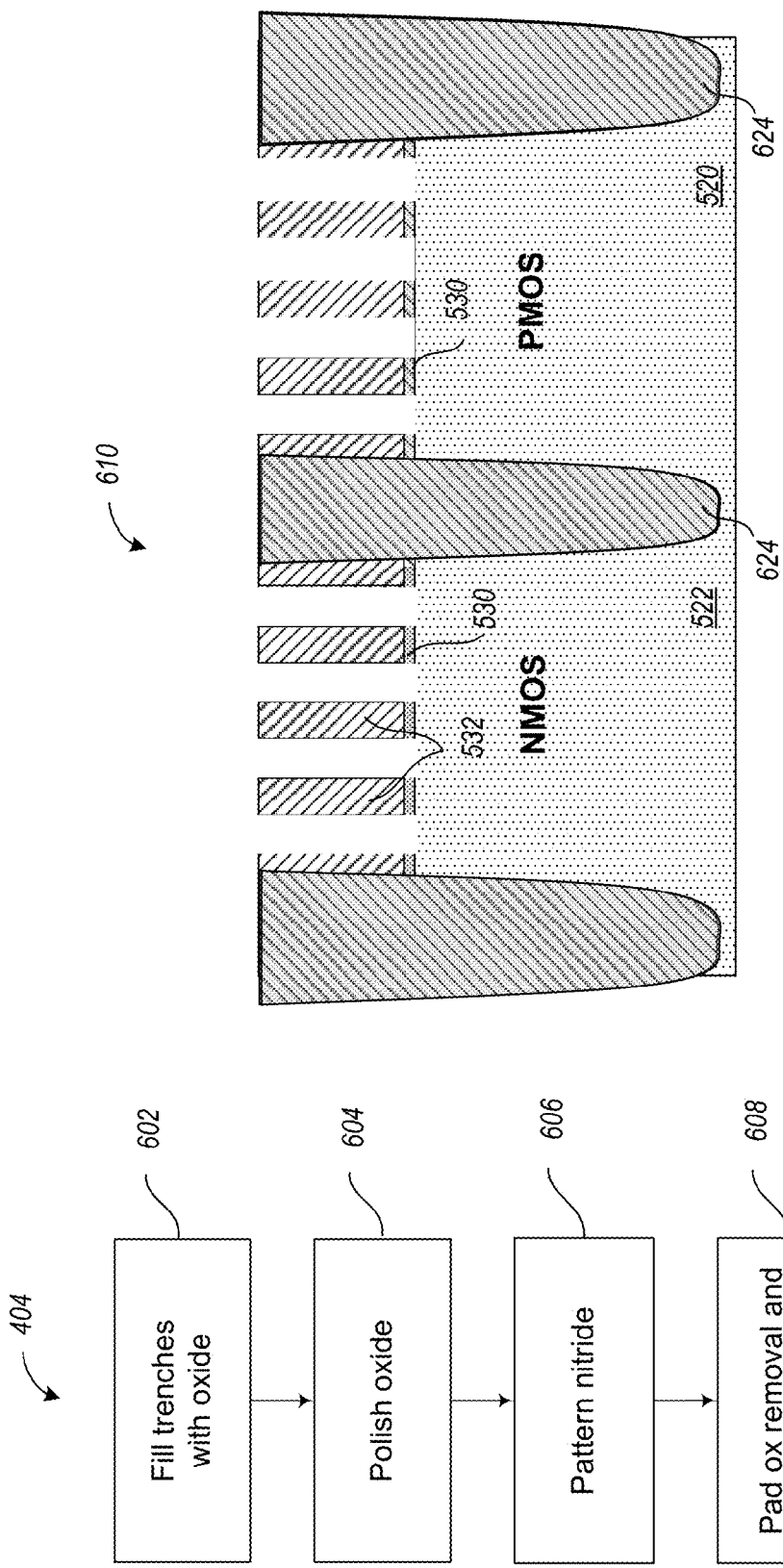

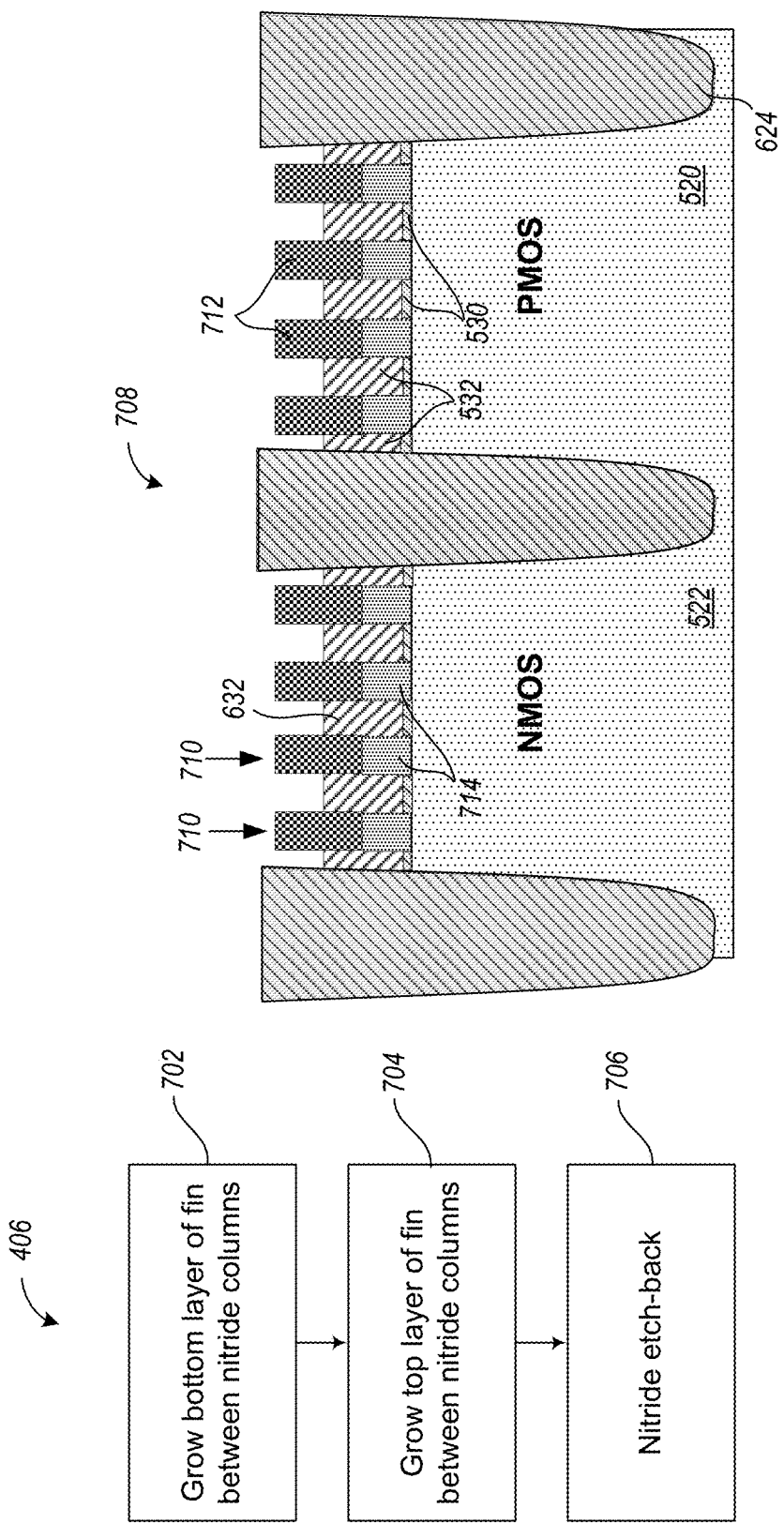

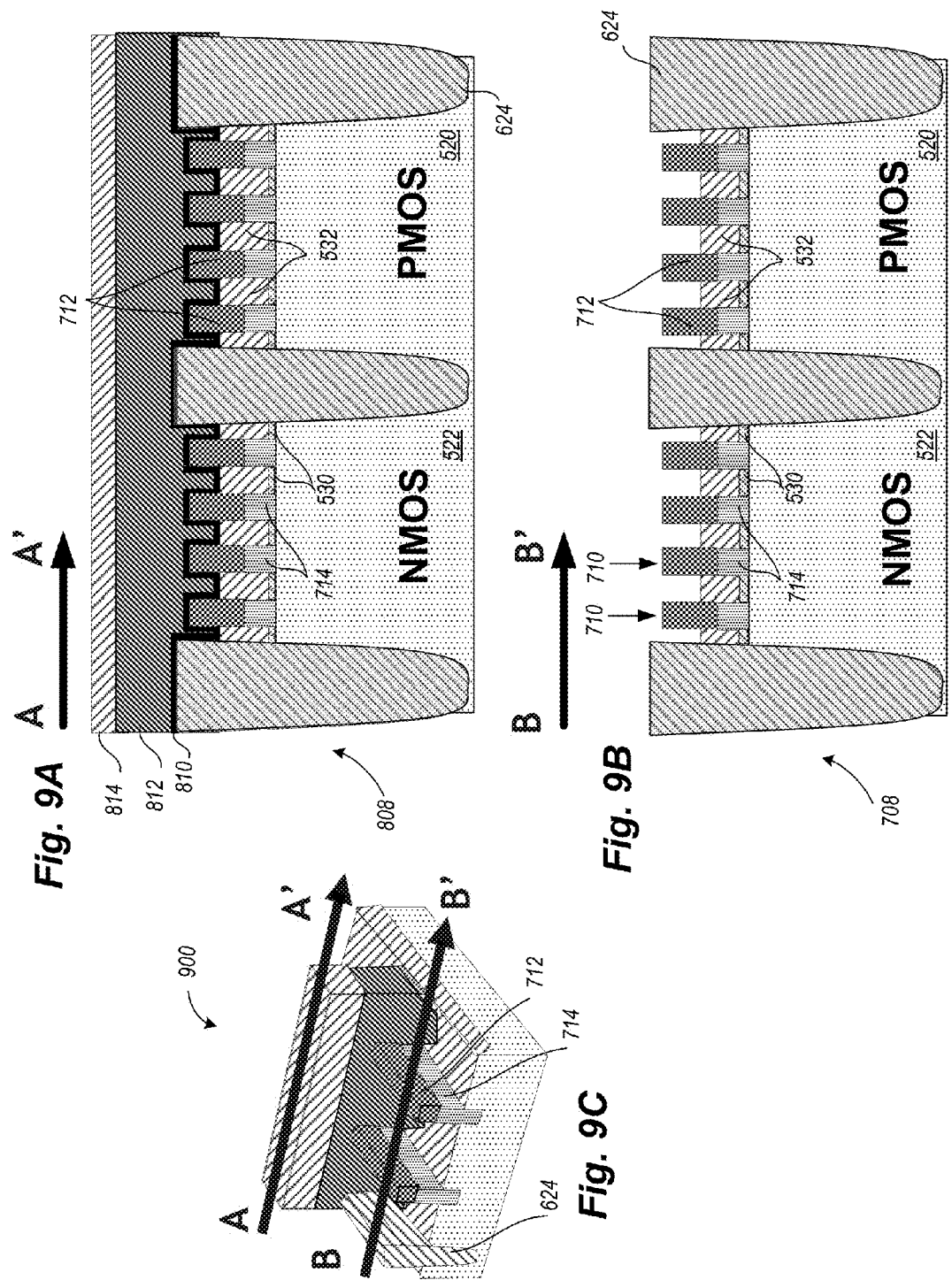

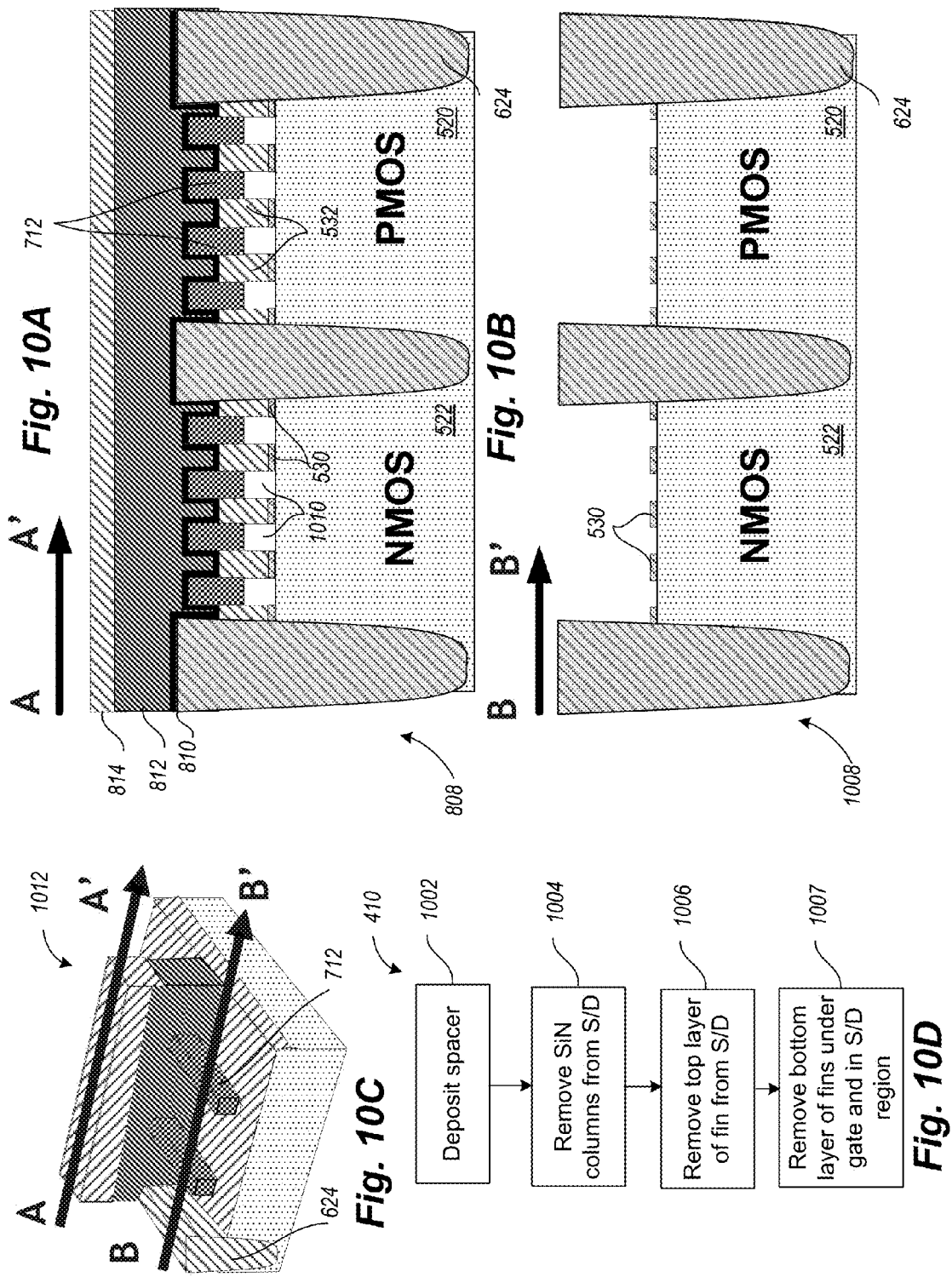

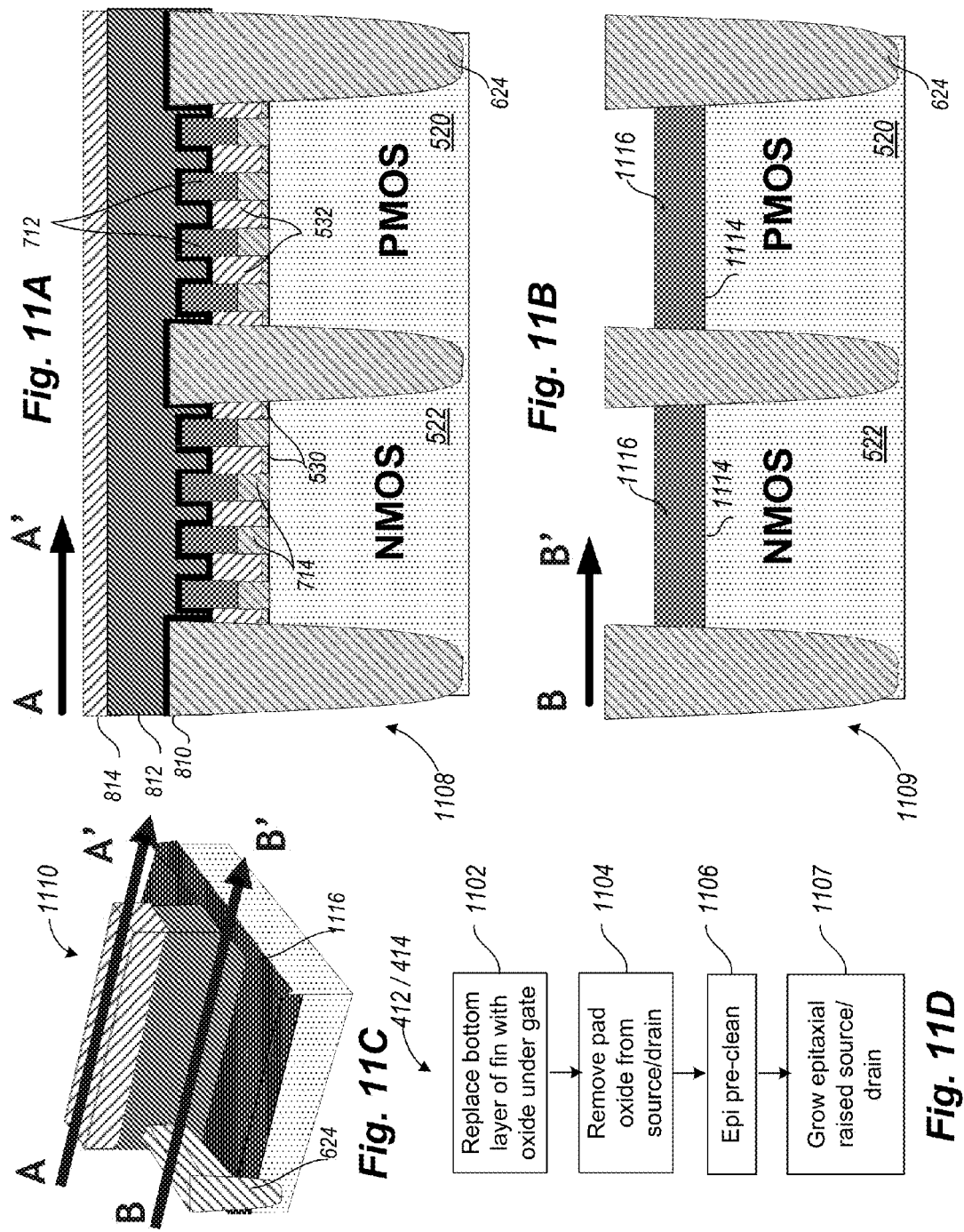

FINFET DEVICE WITH ISOLATED CHANNEL

BACKGROUND

1. Technical Field

The present disclosure relates to the fabrication of integrated circuit transistors, and in particular, low-leakage three-dimensional FinFET (Fin Field Effect Transistor) devices.

2. Description of the Related Art

In digital circuits, a transistor is a switch which ideally: a) passes zero current when it is off; b) supplies large current flow when it is on; and c) switches instantly between the on and off states. Unfortunately, a transistor is not ideal as constructed in an integrated circuit and tends to leak current even when it is off. Current that leaks through, or out of, the device tends to drain the battery that supplies power to the device. For many years, integrated circuit transistor performance was improved by shrinking critical dimensions to increase switching speed. However, as dimensions of silicon-based transistors continue to shrink, maintaining control of various electrical characteristics, including off-state leakage, becomes increasingly more challenging, while performance benefits derived from shrinking the device dimensions have become less significant. It is therefore advantageous, in general, to reduce leakage current in the transistor by alternative means, including changes in materials and device geometry.

Integrated circuits typically incorporate FETs in which current flows through a semiconducting channel between a source and a drain, in response to a voltage applied to a gate. A traditional planar (2-D) transistor structure is shown in FIG. 1A and described below in greater detail. To provide better control of the current flow, FinFET transistors, sometimes called 3D transistors, have been developed, such as the one shown in FIG. 1B. A FinFET is an electronic switching device in which the planar semiconducting channel of a traditional FET is replaced by a semiconducting fin that extends outward, normal to the substrate surface. In such a device, the gate, which controls current flow in the fin, wraps around three sides of the fin so as to influence the current flow from three surfaces instead of one. The improved control achieved with a FinFET design results in faster switching performance and reduced current leakage.

Intel described this type of transistor in an announcement on May 4, 2011, calling it by various names including a 3D transistor, a 3-D Tri-Gate transistor, or a FinFET. (See, for example, the article titled "How Intel's 3D tech redefines the transistor" located on the internet at http://news.cnet.com/8301-13924_3-20059431-64.html; see also U.S. Publication No. 2009/0090976, to Kavalieros et al., published on Apr. 9, 2009; U.S. Pat. No. 8,120,073 to Rakshit et al.; U.S. Pat. No. 7,973,389 to Rios et al.; U.S. Pat. No. 7,456,476 to Hareland et al.; and U.S. Pat. No. 7,427,794 to Chau et al.).

An array of semiconducting fins is shown in FIG. 2. Typically, an array of multiple transistors can be formed by conformally depositing a common gate over an array of fins. Furthermore, an array of multi-gate transistors can be formed by conformally depositing multiple common gates over the array of fins. Such a FinFET array having three gates between source and drain regions is known as a tri-gate transistor.

Prior to the development of FinFETs, strained silicon transistors were developed to increase control of the mobility of charge carriers in the semiconducting channel. Introducing compressive strain into the transistor materials tends to increase charge mobility, resulting in a faster switching response to changes in voltage applied to the gate. Strain can be introduced, for example, by replacing bulk silicon in the source and drain regions, or in the channel itself, with epitaxially-grown silicon compounds. The term epitaxy refers to a controlled process of crystal growth in which a new, epitaxial, layer of a crystal is grown from the surface of a bulk crystal, while maintaining the same crystal structure of the underlying bulk crystal.

Despite improvements provided by three dimensional structures and strained silicon materials, transistors continue to suffer certain types of performance degradation as device dimensions shrink into the range of 1-50 nanometers. These include, in particular, leakage of charge between the semiconducting channel and the substrate.

BRIEF SUMMARY

According to one embodiment as described herein, channel-to-substrate leakage in a FinFET device is prevented by isolating the channel, which is the fin, from the substrate by inserting an insulating layer between the channel and the substrate. The insulating layer isolates the fin from the substrate both physically and electrically, thus preventing current leakage between the fin and the substrate. Theoretically, when there is no leakage, the device is either all on or all off.

Unlike conventional FinFET fabrication processes in which fins are formed by depositing and etching the fin material, the process described herein grows an array of fins epitaxially from the silicon surface, in the spaces between insulating columns that are pre-arranged in an array. The insulating columns provide localized insulation between adjacent fins.

If the fins contain two different materials, the lower material can be easily removed, while leaving the upper material, thus yielding an interdigitated array of insulating columns and having semiconducting fins suspended above the silicon surface. A resulting gap underneath the remaining upper fin material can then be filled in with oxide if desired to better support the fins and aid to isolate the array of fin channels from the substrate.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 6A is a process flow diagram showing a further sequence of process steps that can be used to form an array of nitride columns.

FIG. 6B is a side view of a device profile formed by the process flow shown in FIG. 6A, in which the trenches shown in FIG. 5B have been filled and an array of nitride columns has been formed in the active region between the trenches.

FIG. 7A illustrates a process flow diagram showing a further sequence of process steps that can be used to form an array of epitaxially-grown bi-layer fins partially interdigitated with the nitride columns shown in FIG. 6B.

FIG. 7B is a side view of a device profile formed by the process flow shown in FIG. 7A, in which a partially-interdigitated structure of epitaxial semiconducting fins and nitride columns has been established.

FIGS. 9A, 10A, and 11A are side views cut along lines A-A' of the FinFET device profile in the gate region during a process in which the channel is isolated from the substrate.

FIGS. 9B, 10B, and 11B are side views cut along lines B-B' of the FinFET device profile in the source/drain region during removal of a sacrificial interdigitated structure and formation of an epitaxial raised source/drain.

FIGS. 9C, 10C, and 11C are perspective views of a two-transistor structure as described herein, showing both the gate region (A-A'), and changes in the source/drain region profiles (B-B') as the source/drain structures are being formed.

FIGS. 10D and 11D are process flow diagrams, each showing a further sequence of process steps that can be used to form the structures in FIGS. 10A-10C and 11A-11C, respectively.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to insulating materials can include various materials other than those used to illustrate specific embodiments of the transistor devices presented. The term "epitaxial silicon compounds" should not be construed narrowly to limit an epitaxially grown structure to Si, SiGe, or SiC, for example, but rather, the term "epitaxial silicon compounds" is broadly construed to cover any compounds that can be grown epitaxially from a silicon substrate.

Specific embodiments are described herein with reference to examples of FinFET structures that have been produced. The FinFET structures are also referred to as 3-D transistors in some publications or alternatively as tri-gate or multi-gate structures. The use of the term FinFET or fin transistor as used herein includes all structures of this type and is meant in the broad sense of which a 3D transistor or tri-gate transistor is a subset. The present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

Figures 1A, 1B:
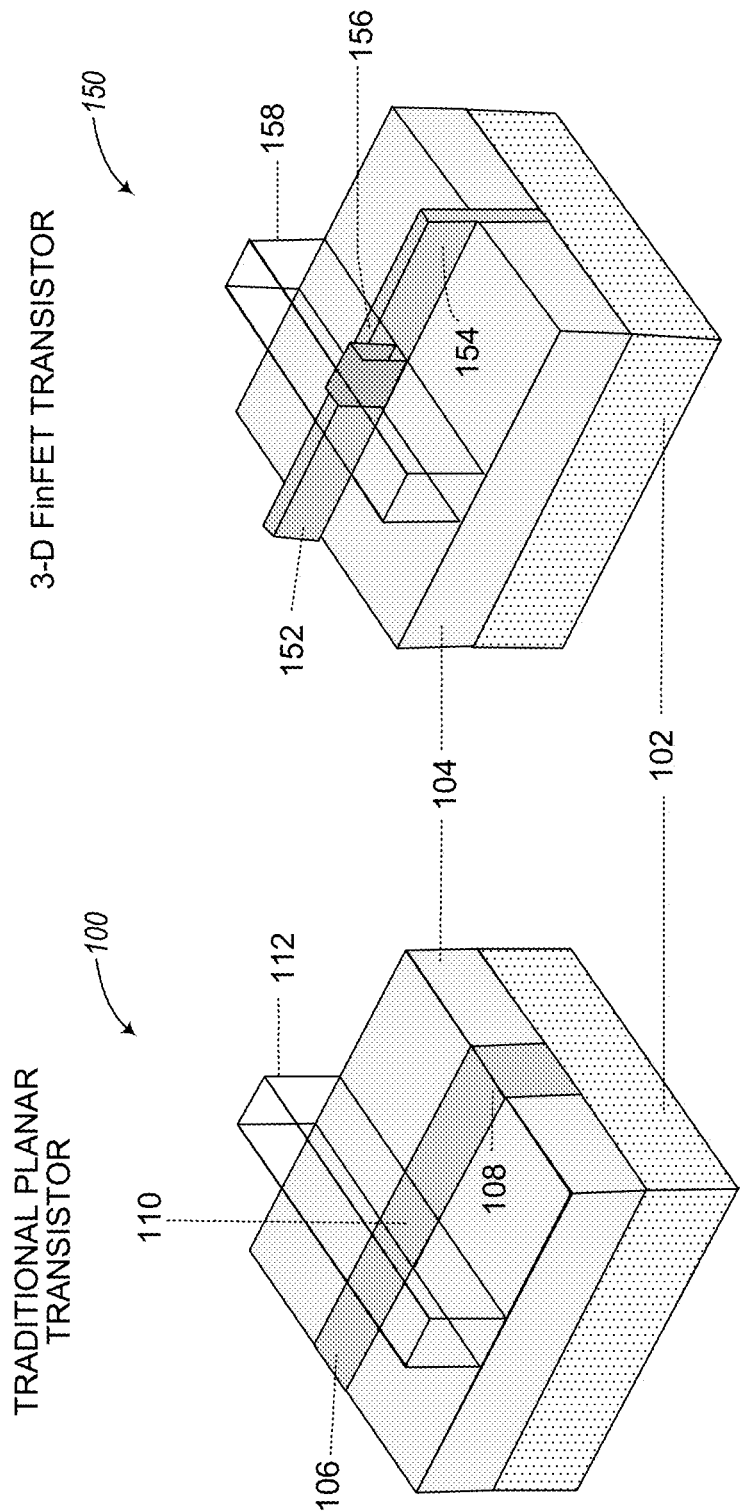
FIG. 1A is a pictorial perspective view of a prior art planar FET.
FIG. 1B is a pictorial perspective view of a prior art FinFET.

FIG. 1A shows a conventional planar transistor 100 built on a silicon substrate 102. Parts of the conventional planar transistor include an active region 104, a source 106, a drain 108, a planar conducting channel 110, and a gate 112. A gate dielectric, not shown, electrically isolates the channel from the gate, as is well known in the art. The active region 104 occupies an upper layer of the substrate that may be doped with impurities to create a well having a net negative or net positive charge. When the conventional planar transistor 100 is on, current flows from the source 106 to the drain 108, through the planar conducting channel 110. Current flow in the planar conducting channel is controlled by the gate 112 by application of a gate voltage. An electric field associated with the gate voltage has the effect of turning on the conventional planar transistor 100 if the gate voltage exceeds a certain threshold. If the applied gate voltage drops below the threshold voltage, the conventional planar transistor 100 shuts off and current ceases to flow from the source 106 to the drain 108. Because the gate 112 can only influence the planar conducting channel 110 from one side (i.e., from the top of the planar conducting channel 110), charge leakage into the silicon substrate 102 tends to occur at the channel/substrate junction.

FIG. 1B shows a conventional FinFET device 150 built on the silicon substrate 102. Analogous to the device shown in FIG. 1A, parts of the conventional FinFET device 150 include an active region 104, a source 152, a drain 154, a conducting fin channel 156, and a wrap-around gate 158. The active region 104 of the conventional FinFET device 150 may be doped with impurities to create a well having a net negative or net positive charge. When the conventional FinFET device 150 is on, current flows from the source 152 to the drain 154, through the tall, conducting fin channel 156, under control of the wrap-around gate 158. Application of a voltage having a value that exceeds a certain threshold voltage value turns the conventional FinFET device 150 on. If the applied voltage drops below the threshold voltage value, the conventional FinFET device 150 shuts off and current ceases to flow from the source 152 to the drain 154. Because the wrap-around gate 158 influences the conducting fin channel 160 from three sides, improved control of the conduction properties of the conducting fin channel 156 is achieved. Such improved control causes leakage of charge from the conducting fin channel 156 to the silicon substrate 102 to be reduced, although not eliminated. Because the current-carrying capacity of the fin channel 160 is much greater than that of the planar conducting channel 110, the switching characteristics of the conventional FinFET device 150 are also improved over those of the conventional planar transistor 100.

Figure 2:
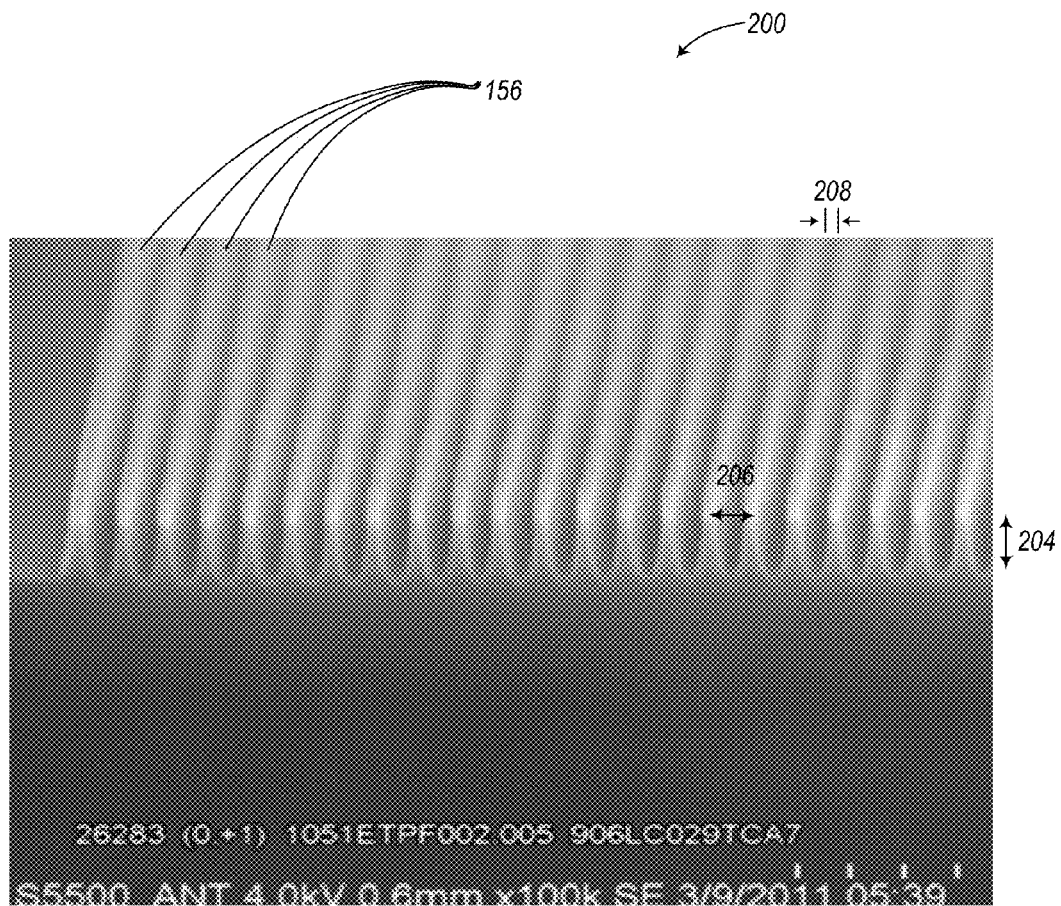
FIG. 2 is a perspective view of an array of epitaxially grown semiconducting fins, derived from an actual scanning electron microscope (SEM) image.

FIG. 2 shows an array of epitaxially grown semiconducting fins. 200. Fins 156 for this type of transistor can be constructed in 22 nm technology and smaller. For example, the width of fin 156 may be in the range of 18-22 nm, the height 204 in the range of 25-100 nm, with a range of 50-75 nm preferred. The space 200 between the fins 156 can be in the same range as the width of the fins, for example, 18-22 nm.

The pitch 206 of the fins, namely, distance from the center of one fin 156 to the center of the next fin 156, which is also the distance from the center of one space 208 to the center of the next space 208, will generally be in the range of 40-48 nm for a 22 nm fin and is usually double the width of a fin 156. Thus, for a fin width of 18 nm, a pitch 206 of 36 nm is preferred, but pitches in the range of 30-50 nm may also be used. The cycle of the fins 156 of these general dimensions and smaller are used for the various embodiments of the invention as will now be explained with respect to FIGS. 3-11C. As semiconductor processes advance, the dimensions can also change to match available technology. For example, the fins may be in the range of 8-20 nm in width and have heights that are in the range of 10-200 nm, depending on the desired design characteristic and the geometries available.

Figure 3:
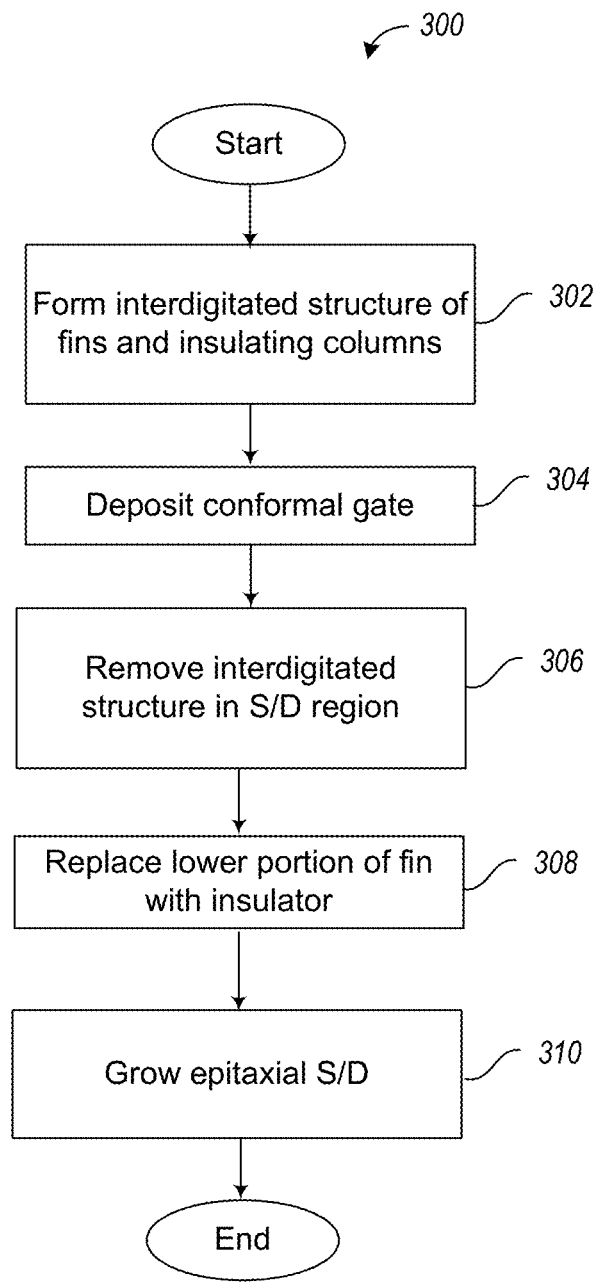
FIG. 3 is a high-level process flow diagram showing basic steps in forming an isolated FinFET as described herein.

FIG. 3 is a high-level flow diagram describing basic actions in a fabrication process 300 for an isolated channel FinFET device designed to prevent channel-to-substrate leakage. At 302, an interdigitated structure of bi-layer fins and insulating columns is formed on a silicon substrate. At 304, a conformal gate is deposited. At 306, the entire interdigitated structure is removed from the source/drain regions while the structure remains in the gate region. At 308, in the gate region, a lower portion of the bi-layer fins is replaced with an insulator, thus electrically isolating the interdigitated structure from the substrate. At 310, an epitaxial raised source/drain is formed.

Figure 4:
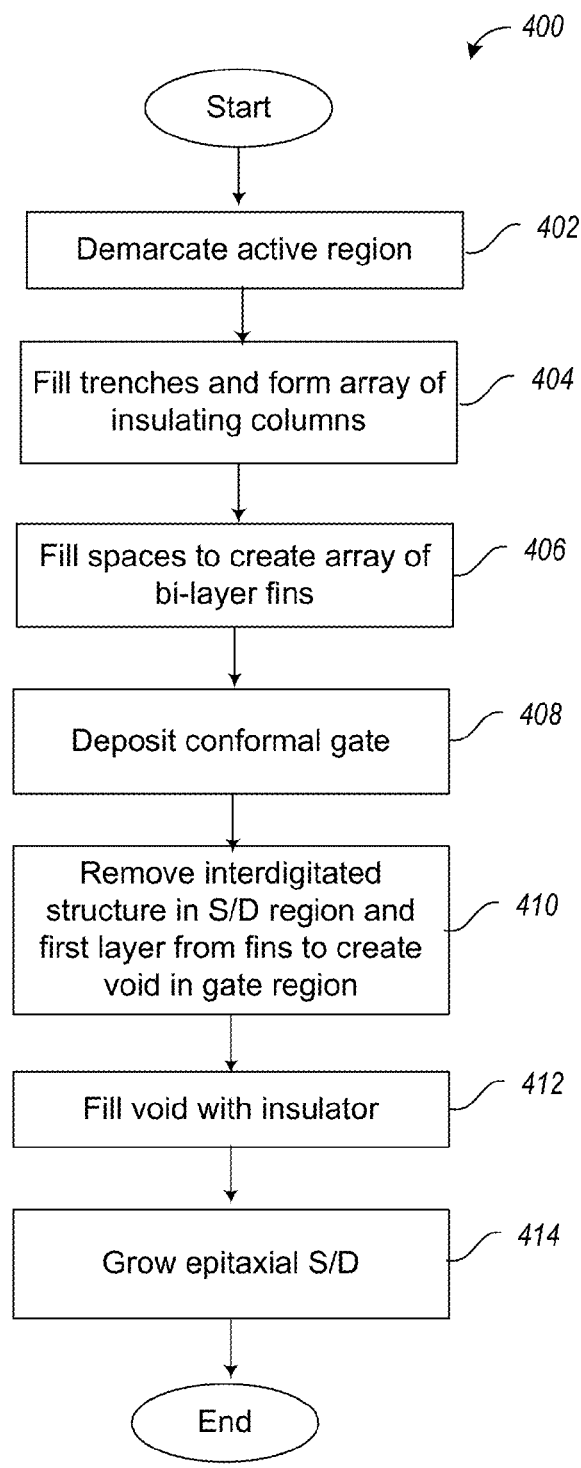
FIG. 4 is a medium-level process flow diagram showing additional details in the process of forming the isolated FinFET described herein.

FIG. 4 is a more detailed flow diagram describing in more detail fabrication process 400 for the isolated channel FinFET device. At 402, an active region is demarcated by forming a pair of insulating trenches in the silicon substrate. The insulating trenches form an electrical barrier between the active region where the FinFET device will be formed, and neighboring regions. At 404, the trenches are filled with an insulating material, for example, a silicon oxide, and the nitride hard mask that was used to form the trenches is patterned to form an array of insulating columns. At 406, spaces defined by the array of insulating columns are filled by epitaxial growth of various silicon compounds, to form an array of bi-layer fin channels. Each bi-layer fin channel includes a lower layer and an upper layer. At 408, a conformal gate is deposited. At 410, the interdigitated structure is removed from the source/drain region, but not from the gate region. During part of the removal process 410, the lower layer of the fin channels in the gate region is also removed to create a void between the substrate and the upper layer of the fin channels. Because this lower layer is used as a temporary place holder, it is referred to as a sacrificial layer. At 412, the void is filled with an insulating material, e.g., a silicon oxide. At 414, an epitaxial raised source/drain is formed.

With reference to FIGS. 5A-11D below, each set of figures shows one of the process steps from FIG. 4 in more detail by presenting a more detailed sequence of process steps and a corresponding side view that results upon completion of that sequence of steps.

Figures 5A, 5B:
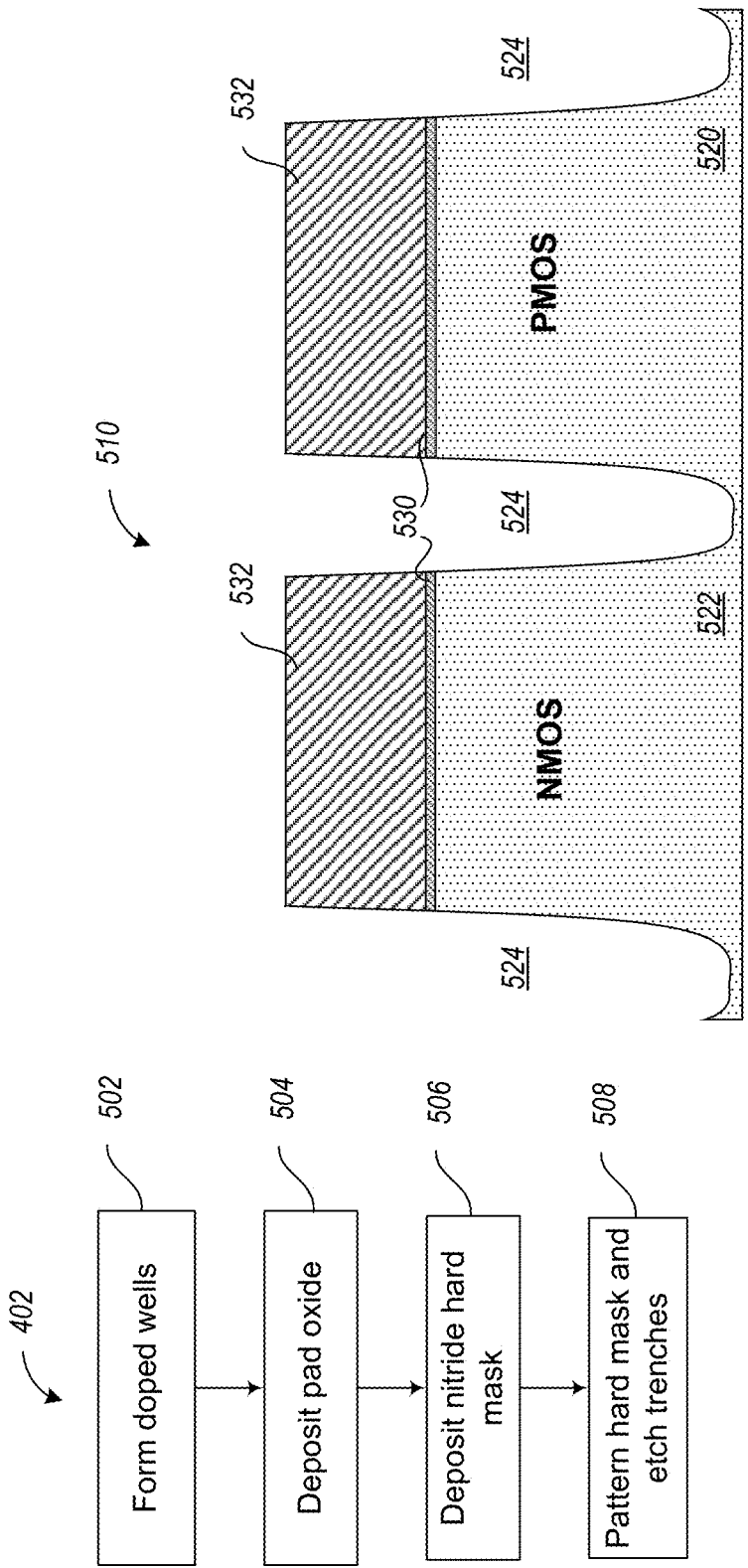
FIG. 5A is a process flow diagram showing a sequence of process steps that can be used to define NMOS and PMOS devices and form isolation trenches.
FIG. 5B is a side view of a device profile formed by the process flow shown in FIG. 5A, in which isolation trenches have been etched in a silicon substrate.

FIGS. 5A and 5B illustrate the step 402 in greater detail, in which an active region is demarcated by forming a pair of insulating trenches in a silicon substrate. FIG. 5A shows a sequence of process steps, including the steps 502, 504, 506, and 508, that can be carried out to form the trench structure 510 shown in FIG. 5B. The trench structure 510 includes an N-doped substrate 520, a P-doped substrate 522, trenches 524 (three shown), a pad oxide layer 530, and a silicon nitride layer 532.

At 502, doped wells are formed in the silicon substrate to facilitate formation of NMOS and PMOS devices. PMOS devices are typically formed in an N-well that is doped with a material having an excess of electrons (e.g., Group V elements such as phosphorous or arsenic). NMOS devices are typically formed in a P-well that is doped with a material lacking valence electrons (e.g., a Group III element, typically boron).

At 504, the pad oxide layer 530 is grown by a standard technique, for example, exposing the silicon to an oxygen-rich environment at high temperature for thermal oxidation of the silicon. The pad oxide layer 530 is a thin insulating layer used to passivate the silicon surface. Removal of a native oxide layer on the silicon surface can precede the growth of the pad oxide layer 530.

At 506, the silicon nitride layer 532 is deposited by a standard technique, for example, chemical vapor deposition (CVD), plasma vapor deposition (PVD), or the like. The silicon nitride layer 532 can then be patterned using conventional optical lithography and etch processes. Because conventional optical lithography is well-known to those skilled in the art of semiconductor processing, it is not explicitly shown in the figures, but will be described briefly. Conventional optical lithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the mask pattern into one or more underlying layers. Typically, a photoresist mask can be used if the subsequent etch is relatively shallow, because photoresist is likely to be consumed during the etch process.

At 508, the silicon nitride layer 532 is patterned and etched, for example, using a directed (anisotropic) plasma etch, also referred to as a reactive ion etch (RIE) process. Following the RIE etch, a standard wet chemical cleaning process can be used to remove residual photoresist. The silicon nitride layer 532 can then, in turn, be used as a hard mask for etching the trenches 524 in the substrate. As is well known to those skilled in the art, such a nitride hard mask technique is desirable when etching deep structures that require a longer etch time, because the nitride hard mask can withstand the etch process more reliably than a photoresist can. The trenches 524 extend into the silicon substrate, well below the active region, in order to provide effective electrical isolation from neighboring regions that may contain other devices. After the trenches 524 are etched, the silicon nitride layer 532 is left in place.

FIGS. 6A and 6B illustrate the step 404 in greater detail, in which the trenches 524 are filled with an insulating material and an array of insulating columns is formed on the surface of the silicon substrate. FIG. 6A shows a sequence of process steps, including the steps 602, 604, 606, and 608 that can be carried out to form the column structure 610 shown in FIG. 6B. The column structure 610 includes filled trenches 624 and insulating columns 632.

At 602, the trenches 524 can be filled with an insulating material such as a silicon dioxide, for example, using a standard deposition method (e.g., CVD). The filled trenches 624 extend above the silicon surface to approximately the top of the silicon nitride layer 532.

At 604, after the trenches are filled, chemical-mechanical planarization (CMP) can be performed to planarize the oxide in the filled trenches 624, using the silicon nitride layer 532 as a polish stop layer. This technique results in the oxide trench fill and silicon nitride layer 532 being at a substantially equivalent height.

At 606, the silicon nitride layer 532 is patterned again, using conventional optical lithography and etch processes as described above to produce the array of insulating columns 632 shown in FIG. 6B. When etching the silicon nitride insulating columns 632, the pad oxide 530 can serve as an etch stop layer.

At 608, an epitaxial pre-cleaning step (e.g., a hydrofluoric acid (HF) clean) can be performed to remove the pad oxide 530 between the nitride columns, and to prepare the underlying silicon as a nucleation surface for epitaxial growth.

FIGS. 7A and 7B illustrate the step 406 in greater detail, in which spaces defined by the array of insulating columns 632 can be filled by epitaxial growth of various silicon compounds. Such epitaxial growth forms an array of bi-layer fins 710, wherein each fin 710 will selectively electrically coupling a source to a drain. The bi-layer fins 710 are aligned substantially parallel to the filled trenches 624. FIG. 7A shows a sequence of process steps including the steps 702, 704, and 706 that can be carried out to form the interdigitated structure 708 shown in FIG. 7B. The interdigitated structure 708 includes the insulating columns 632 and the bi-layer fins 710, including upper layers 712 and lower layers 714.

At 702, the lower layers 714 of the bi-layer fins 710 can be formed by epitaxial growth of a semiconducting material. Epitaxial silicon compounds used for the lower layer 714 can be, for example, silicon germanium (SiGe) in which the germanium content is within the range of about 20% to about 60%.

At 704, the upper layers 712 of the bi-layer fins 710 are desirably epitaxial silicon compounds such as, for example, silicon, SiGe, or silicon carbide (SiC). The SiGe used for the upper layers 712 of the bi-layer fins 710 can be a different composition than that used for the lower layer 714. For example, the upper layers 712 can contain 0 to about 25% germanium. The lower fin layer 714 will be made of a material that is selectively etchable with respect to the upper fin layer 712. For example, pure silicon is selectively etchable with respect to a SiGe layer that is 20%-30% germanium. Similarly, a lower layer 714 of SiGe having 50% Ge is selectively etchable with respect to an upper layer 712 of SiGe that is in the range of 0%-25% germanium. Similarly, an upper layer 712 that contains some carbon, such as an SiC or an SiGeC layer permits the lower layer 714 to be selectively etched that contains no carbon, such as Si or SiGe. A choice of epitaxial SiGe and SiC as materials making up the bi-layer fin 710 can produce more strain in the fin channel than is typically produced using conventional methods. Thus, each of the bi-layer fins 710 is formed between a pair of insulating columns, which provide localized isolation.

At 706, following epitaxial growth of the bi-layer fins 710, a nitride etch back step can be performed in which at least a top portion of the array of insulating columns 632 is removed, for example, using a phosphoric acid ($H_3PO_4$) nitride removal process that is selective to both oxide and to the epitaxially grown silicon compounds. It is desirable to etch back the nitride layer, to at least half the height of upper layer 717 and in some cases, to be only 10%-30% along the height of the upper layer 712. It is preferred to not completely remove the nitride layer since it will provide structural support to the fin 710 when the lower fin 714 is removed.

Figures 8A, 8B:
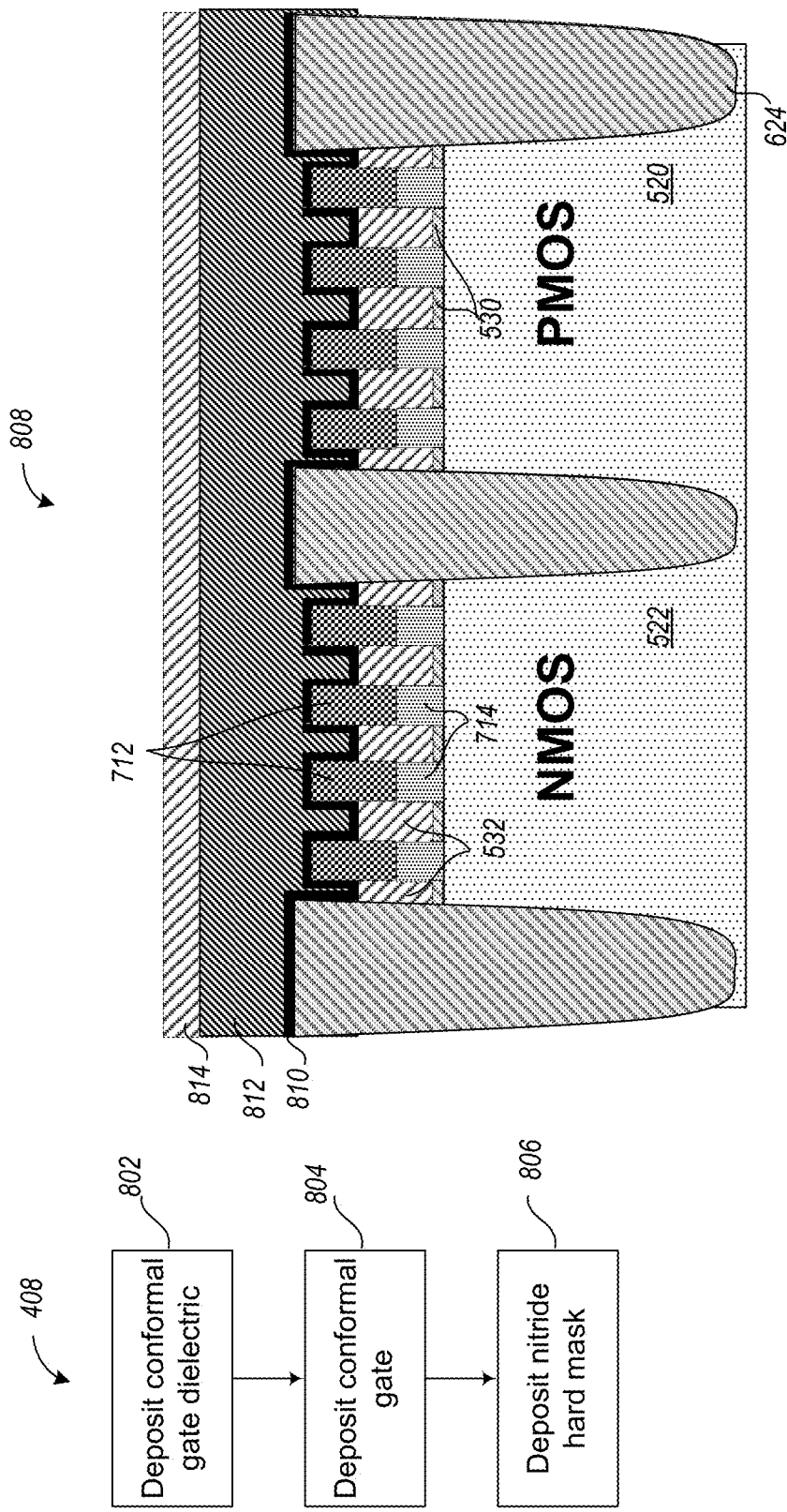
FIG. 8A is a process flow diagram showing a further sequence of process steps that can be used to form a gate contiguous with three sides of the semiconducting fins shown in FIG. 7B.
FIG. 8B is a side view of a device profile formed by the process flow shown in FIG. 8A, in which a conformal gate and a nitride hard mask are deposited over the interdigitated structures shown in FIG. 7B.

FIGS. 8A and 8B illustrate the step 408 in greater detail, in which a conformal gate is deposited, overlying the interdigitated structure 708. FIG. 8A shows a detailed sequence of process steps, including the steps 802, 804, and 806 that can be carried out to form the conformal gate structure 808 shown in FIG. 8B. The conformal gate structure 808 includes a gate dielectric 810, a gate 812, and a silicon nitride hard mask 814.

At 802, the gate dielectric 810 can be conformally deposited over the interdigitated structure 708. Composition of the gate dielectric 810 can be silicon dioxide, having a dielectric constant of about 4.0, or, more desirably, the gate dielectric can be a high dielectric constant (high K) material having a dielectric constant in the range of about 5.0-10.0 or higher. Such high dielectric constant materials include, for example, hafnium oxides and hafnium silicates. The gate dielectric 810 can be deposited using, for example, a thermal growth process or a CVD process.

At 804, the gate 812 can be deposited. Composition of a bulk gate material forming the gate 812 may include a work function metal alloy, for example, tantalum nitride (TaN), titanium nitride (TiN), or titanium aluminum (TiAl). A conventional metal deposition process can be used to deposit the gate 812, such as CVD, PVD, an electroplating process, or an electro-less plating process. Alternatively, a conventional polysilicon gate 812 can be deposited at 804. The gate dielectric 810 and the gate 812, together, wrap around the bi-layer fins 710 so that they are at least partially contiguous to three sides of each semiconducting fin. The gate 812 thus is operable to control current flow within the semiconducting fin in response to an applied voltage.

At 806, the silicon nitride hard mask 814 can be deposited using conventional deposition methods. The silicon nitride hard mask 814 can be used to mask the conformal gate structure 808 and the underlying interdigitated structure 708 so these structures remain unaffected by subsequent processing steps intended for the source and drain regions.

FIGS. 9A, 9B, and 9C illustrate the conformal gate structure 808 in greater detail. FIG. 9A is a reproduction of FIG. 8B, i.e., FIG. 9A is a side view of the FinFET device in the gate region, along a cut line A-A', as shown in the perspective view 900 presented in FIG. 9C. FIG. 9B is a side view of the FinFET device in the source/drain regions, along a cut line B-B', as shown in the perspective view 900 presented in FIG. 9C. Because the conformal gate is not deposited over the source/drain regions, FIG. 9B shows the same interdigitated structure 708 that appears in FIG. 7B, prior to depositing the conformal gate structure 808 along A-A'.

In FIGS. 9C, 10C and 11C, the nitride columns 532 are not shown at all locations to avoid obscuring the layers 712 and 714 of the fins 710. Rather, only one nitride column 532 is shown on the far left. Also, the FIGS. 9C, 10C and 11C are at an enlarged spacing scale and show only two of the fins 712 and 714, again for clarity and to avoid blocking some of the features.

FIGS. 10A, 10B, and 10C illustrate the step 410 in greater detail, in which the interdigitated structure is removed from the source/drain regions and a void is formed between each fin and the substrate in the gate region. FIG. 10D shows a sequence of process steps, including the steps 1002, 1004, 1006, and 1007 that can be carried out to form voids 1010 in place of the lower fin layer 714 within the conformal gate structure 808 (FIG. 10A), and the fin-less structure 1008 in the source/drain regions (FIG. 10B). A perspective view 1012 of the fin-less structure 1008 is visible in FIG. 10C.

At 1002, a conventional spacer is deposited on both sides of the conformal gate structure 808. (The spacer does not appear in either one of the side views, because it lies between the cut lines A-A' and B-B'.) A sidewall spacer of this type is known in the art and therefore would be understood.

At 1004, the array of insulating columns 632 is then removed from the source/drain regions only, by masking the gate regions and the etching. Alternatively an anisotropic etch that is a plasma etch (RIE) process can be used to remove SiN with high selectivity to oxide and silicon using the gate as an etch mask.

At 1006, the upper layers 712 of the bi-layer fin channels are removed in the source/drain regions. Removal of the upper layers 712 of the fin channels can be achieved by using a timed, anisotropic plasma etch process (RIE). Selectivity to the lower layers 714 is not critical, because the entire inter-digitated structure in the source/drain regions is sacrificial.

At 1007, the lower layers 714 of the bi-layer fin channels are removed from both the source/drain regions (FIG. 10B) and also at the gate regions (FIG. 10A) to form voids 1010 in the gate region. The voids 1010 provide an insulating layer between the upper layers 712 and the substrate. The voids 1010 can be formed using a non-plasma chemical vapor etch process. Such a process is substantially isotropic. To achieve a desired selectivity to the upper layers 712 in the gate region, the vapor chemistry used may include hydrochloric acid (HCL). In such a process, selectivity to the upper layers 712 in the gate region may vary based on factors including temperature and pressure of the chemical vapor etch, and relative germanium concentrations of the epitaxial upper and lower layers 712 and 714, respectively. Although the lower layers 714 of the bi-layer fins 710 in the gate regions are covered, and therefore they are not accessible from above, the lower layers 714 will be undercut laterally by the chemical vapor etchant without disturbing surrounding structures because the HCL etch can be formulated so as to be selective to oxide, nitride, and certain compositions of epitaxial silicon compounds. As previously stated, the compound for the lower layer 714 is selected to permit epitaxial growth from the substrate 102 to grow layer 712 as single crystal and to be selectively etchable with respect to layer 712.

FIGS. 11A, 11B, 11C, and 11D illustrate the steps 412 and 414 in greater detail, in which the voids 1010 are filled in the gate region and an epitaxial raised source and drain are formed. FIG. 11D shows a sequence of process steps, including the steps 1102, 1104, and 1106, that can be carried out to form a completed fin structure 1108 in the gate region (FIG. 11A) and a completed epitaxial raised source/drain structure 1109 (FIG. 11B). A perspective view 1110 of the finished isolated channel FinFET device is shown in FIG. 11C.

With reference to FIGS. 10A-10B and 11A-11B, at 1102, the voids 1010 can be filled with an insulating material, for example, an oxide 1112, to substantially block electric charge leakage between the semiconducting fins and the substrate. The oxide 1112 provides a more structurally stable substrate insulating layer than the voids 1010. The oxide 1112 can be formed by thermal growth from the silicon substrate surface by exposure to an oxygenated environment at high temperature.

At 1104, the remaining pad oxide 530 can be etched away using an isotropic, top-down directed oxide etch process that is selective to the silicon nitride hard mask 814. Thus, the pad oxide 530 can be removed in the exposed source/drain regions (FIG. 11B) while the gate region remains unaffected (FIG. 11A).

At 1106, a pre-clean can be performed to remove residual oxide, including native oxide, from the silicon surface 1114 to prepare the silicon surface 1114 for epitaxial growth.

At 1107, a raised source/drain 1116 can be grown epitaxially from the silicon surface 1114, directly after the pre-clean. The presence of pristine 100 crystalline structure at the silicon surface 1114 tends to facilitate epitaxial growth. There are many possible choices for the composition of the epitaxial raised source/drain 1116, for example, epitaxial silicon, an in-situ-doped epitaxial SiGe layer, or an implanted epitaxial SiC layer, among others. Formation of the raised source/drain structure 1109 completes the isolated channel FinFET device.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transistor comprising:
    a silicon substrate;
    an epitaxial source and drain in contact with a surface of the silicon substrate and formed within an active region located between a pair of insulating trenches extending at least partially into the silicon substrate;
    a substrate insulating layer in contact with the silicon substrate within an area located between the source and the drain;
    an array of semiconducting fins positioned between the source and the drain, the array aligned substantially parallel to the trenches, the semiconducting fins selectively electrically coupling the source and the drain while remaining isolated from the silicon substrate by the substrate insulating layer;
    an array of insulating columns at least partially interdigitated with the array of semiconducting fins, the insulating columns providing localized inter-fin isolation; and
    a conformal gate overlying, and at least partially contiguous to, three sides of each semiconducting fin, the gate operable to control current flow within the semiconducting fin in response to an applied voltage.

2. The transistor of claim 1 wherein the semiconducting fins are formed by epitaxial growth of one or more silicon compounds between the insulating columns.

3. The transistor of claim 1 wherein the surface of the silicon substrate has a 100 crystalline structure at the interface with the epitaxial layer.

4. The transistor of claim 1 wherein the substrate insulating layer is configured to substantially block transfer of electric charge between the semiconducting fins and the silicon substrate.

5. The transistor of claim 1 wherein the epitaxial source and drain are doped source and drain structures that extend above the surface of the silicon substrate.

6. A transistor formed on a silicon substrate, the transistor comprising:
    raised source and drain regions positioned between a pair of isolation trenches;

an array of semiconducting fins selectively electrically coupling the source and the drain while remaining isolated from the silicon substrate by a substrate insulating layer;

an array of insulating columns at least partially interdigitated with the array of semiconducting fins, the insulating columns providing localized inter-fin isolation; and a conformal gate structure that wraps around three sides of the semiconducting fins, the conformal gate structure including a gate operable to control current flow within the semiconducting fins in response to an applied voltage.

7. The transistor of claim 6 wherein the insulating columns are made of silicon nitride.

8. The transistor of claim 6 wherein the raised source and drain regions are epitaxially grown.

9. The transistor of claim 6 wherein the semiconducting fins are epitaxially grown.

10. The transistor of claim 9 wherein the epitaxially grown semiconducting fins include one or more of silicon, germanium, silicon germanium, silicon carbide, or silicon germanium carbide.

11. The transistor of claim 6, further comprising sidewall spacers in contact with the gate.

12. The transistor of claim 6, wherein the conformal gate structure further includes a gate dielectric.

13. The transistor of claim 12 wherein the gate dielectric is a made of a material including one or more of silicon dioxide, halfnium oxide, or halfnium silicate.

14. The transistor of claim 6 wherein the gate is made of a material including one or more of polysilicon, tantalum nitride, titanium nitride, or titanium aluminum.

15. A substrate-isolated FinFET module, comprising:
a first array of epitaxial semiconducting fins;
a second array of insulating columns, the first and second arrays partially interdigitated to form a plurality of switches subject to control by a shared gate; and
an isolation layer positioned to block current leakage from the fins into an underlying substrate.

16. The FinFET module of claim 15 wherein the insulating columns are made of silicon nitride.

17. The FinFET module of claim 15 wherein the isolation layer is made of silicon dioxide.

18. The FinFET module of claim 15 wherein the first array of epitaxial semiconducting fins has a pitch in the range of 30-50 nm.

19. The FinFET module of claim 15 wherein fins and columns have a height-to-width ratio in the range of about 3.0-5.0.

20. The FinFET module of claim 15 wherein the epitaxial semiconducting fins include one or more of silicon, germanium, silicon germanium, silicon carbide, or silicon germanium carbide.

* * * * *